United States Patent
Lin

(10) Patent No.: US 10,249,661 B2
(45) Date of Patent: Apr. 2, 2019

(54) IMAGING DEVICES WITH DUMMY PATTERNS

(71) Applicant: VisEra Technologies Company Limited, Hsin-Chu (TW)

(72) Inventor: Ho-Tai Lin, Hsinchu (TW)

(73) Assignee: VISERA TECHNOLOGIES COMPANY LIMITED, Hsin-Chu (TW)

( * ) Notice: Subject to any disclaimer, the term of this patent is extended or adjusted under 35 U.S.C. 154(b) by 647 days.

(21) Appl. No.: 14/466,412

(22) Filed: Aug. 22, 2014

(65) Prior Publication Data

US 2016/0056187 A1    Feb. 25, 2016

(51) Int. Cl.
*G02B 3/00* (2006.01)
*G02B 5/20* (2006.01)
*H01L 27/146* (2006.01)

(52) U.S. Cl.
CPC .... *H01L 27/1462* (2013.01); *H01L 27/14621* (2013.01); *H01L 27/14627* (2013.01); *H01L 27/14685* (2013.01); *G02B 3/0006* (2013.01); *G02B 5/201* (2013.01)

(58) Field of Classification Search
CPC ......... H01L 27/14625; H01L 27/14627; H01L 27/14643
See application file for complete search history.

(56) References Cited

U.S. PATENT DOCUMENTS

| | | | |
|---|---|---|---|
| 6,307,243 B1 * | 10/2001 | Rhodes | 257/432 |
| 7,382,011 B2 * | 6/2008 | Noda et al. | 257/292 |
| 7,688,377 B2 * | 3/2010 | Matsuda et al. | 348/340 |
| 2005/0090035 A1 | 4/2005 | Kim | |
| 2006/0038209 A1 * | 2/2006 | Hashimoto | 257/294 |
| 2006/0202295 A1 * | 9/2006 | Wu | H01L 27/14623 257/432 |

(Continued)

FOREIGN PATENT DOCUMENTS

| CN | 101414616 A | 4/2009 |
|---|---|---|
| JP | 1994-224397 A | 8/1994 |

(Continued)

OTHER PUBLICATIONS

Japanese Office Action dated Feb. 6, 2017, as issued in corresponding Japan Patent Application No. 2015-000093 with English translation (16 pages).

(Continued)

*Primary Examiner* — Yu Chen
*Assistant Examiner* — Vincent Wall
(74) *Attorney, Agent, or Firm* — Muncy, Geissler, Olds & Lowe, P.C.

(57) ABSTRACT

An imaging device is provided. The imaging device includes a plurality of photoelectric conversion elements formed on a substrate in an active area. A microlens structure is disposed above the photoelectric conversion elements. A dummy pattern having a plurality of protruding elements is disposed above the substrate in a peripheral area surrounding the active area. Furthermore, a passivation film is conformally formed on the microlens structure and the dummy pattern. The passivation film on the tops of the protruding elements of the dummy pattern has a surface area smaller than a surface area of the peripheral area outside of the microlens structure.

15 Claims, 6 Drawing Sheets

(56) References Cited

U.S. PATENT DOCUMENTS

| | | | |
|---|---|---|---|
| 2006/0228826 A1* | 10/2006 | Kim et al. | 438/60 |
| 2009/0190009 A1 | 7/2009 | Kawasaki | |
| 2009/0251573 A1* | 10/2009 | Toyoda | 348/273 |
| 2010/0201834 A1* | 8/2010 | Maruyama et al. | 348/222.1 |
| 2011/0045626 A1* | 2/2011 | Kao | 438/70 |
| 2012/0043634 A1* | 2/2012 | Kurihara | 257/432 |
| 2012/0267744 A1 | 10/2012 | Tsuji | |
| 2013/0087874 A1* | 4/2013 | Yomori | 257/432 |

FOREIGN PATENT DOCUMENTS

| | | |
|---|---|---|
| JP | 2005-129952 A | 5/2005 |
| JP | 2007173535 A | 7/2007 |
| JP | 2008-091399 A | 4/2008 |
| JP | 2009-177079 A | 8/2009 |
| JP | 2012-204402 A | 10/2012 |
| JP | 2012-227474 A | 11/2012 |
| JP | 2012-252259 A | 12/2012 |
| JP | 2014103299 A | 6/2014 |

OTHER PUBLICATIONS

Chinese Patent Office. Office Action. dated Sep. 29, 2018. 6 pages.
Office Action dated Oct. 31, 2017 in corresponding CN Application No. 201410748543.1 (5 pages).

* cited by examiner

IMAGING DEVICES WITH DUMMY PATTERNS

BACKGROUND OF THE INVENTION

Field of the Invention

The invention relates to imaging devices, and more particularly, to imaging devices with dummy patterns to prevent a passivation film from peeling.

Description of the Related Art

Image sensors have been widely used in various image-capturing apparatuses, for example video cameras, digital cameras and the like. Generally, solid-state imaging devices, for example charge-coupled device (CCD) sensors or complementary metal-oxide semiconductor (CMOS) sensors, have photoelectric transducers such as photodiodes for converting light into electric charges. The photodiodes are formed on a semiconductor substrate such as a silicon chip. Signal charges corresponding to photoelectrons generated in the photodiodes are obtained by a CCD-type or a CMOS-type reading circuit.

In solid-state imaging devices, the photodiodes are arranged in a pixel array. In addition, the solid-state imaging devices have a microlenses array disposed over the photodiodes. Each microlens element of the microlens array is aligned with a corresponding photodiode in each pixel. A protection film may be formed on the microlens array to protect the microlens elements during subsequent process steps, such as dicing individual chips from a wafer in a package process of the imaging devices.

BRIEF SUMMARY OF THE INVENTION

In some imaging devices, a passivation film is formed on a microlens structure for protection. When a substrate of the imaging device is thinned by a polishing process, a tape is usually attached on the passivation film to protect the imaging devices. After the substrate is thinned, the tape is removed from the imaging device. However, the removal of the tape causes the passivation film to peel off. The passivation film peeling issue would disadvantageously reduce the package yield of the imaging devices.

According to embodiments of the disclosure, various dummy pattern structure designs of imaging devices can reduce a contact area between a tape and a passivation film deposited on the dummy pattern. Thus, when the tape is removed, the passivation film peeling issue can be overcome by the dummy pattern structure designs of the disclosure.

In some embodiments of the disclosure, an imaging device is provided. The imaging device includes a plurality of photoelectric conversion elements formed on a substrate in an active area. A microlens structure is further disposed above the photoelectric conversion elements. In addition, a dummy pattern is disposed above the substrate in a peripheral area surrounding the active area. Furthermore, a passivation film is conformally formed on the microlens structure and the dummy pattern. The passivation film formed on a top of the dummy pattern has a surface area smaller than a surface area of the peripheral area outside of the microlens structure.

In some embodiments, the dummy pattern includes a plurality of protruding elements. Each protruding element has a shape including a convex, a cylinder, a prism, a cone or a pyramid.

In some embodiments, the dummy pattern consists of convex-shaped protruding elements. The convex-shaped protruding element has a shape the same as a shape of each microlens element of the microlens structure. Furthermore, the convex-shaped protruding elements of the dummy pattern are level with the microlens structure.

In some embodiments, the top of the dummy pattern is lower than or higher than a top of the microlens structure.

In some embodiments, the passivation film on the top of the dummy pattern is in contact with a tape covering the microlens structure and the dummy pattern. In some embodiments, the surface area of the passivation film on the top of the dummy pattern is about 50-80% of the surface area of the peripheral area outside of the microlens structure.

In some embodiments, the imaging device further includes a color filter layer disposed between the microlens structure and the photoelectric conversion elements. The color filter layer includes an extended portion disposed in the peripheral area. The dummy pattern is disposed over the extended portion of the color filter layer.

In some embodiments, the microlens structure has a portion extending from the active area to the peripheral area. The portion of the microlens structure connects with the dummy pattern. In some embodiments, the microlens structure is surrounded by the dummy pattern.

In some embodiments, the dummy pattern is regularly arranged in the peripheral area. The peripheral area may be completely occupied by the dummy pattern. In other embodiments, the dummy pattern is randomly arranged in the peripheral area. A portion of the peripheral area is not occupied by the dummy pattern.

In some embodiments, the material of the dummy pattern is the same as that of the microlens structure. In some embodiments, the material of the passivation film includes a silicon oxide formed by a chemical vapor deposition.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the contemplated mode of carrying out the invention. This description is made for the purpose of illustrating the general principles of the invention and should not be taken in a limiting sense. The scope of the invention is best determined by reference to the appended claims.

Figure 1A:
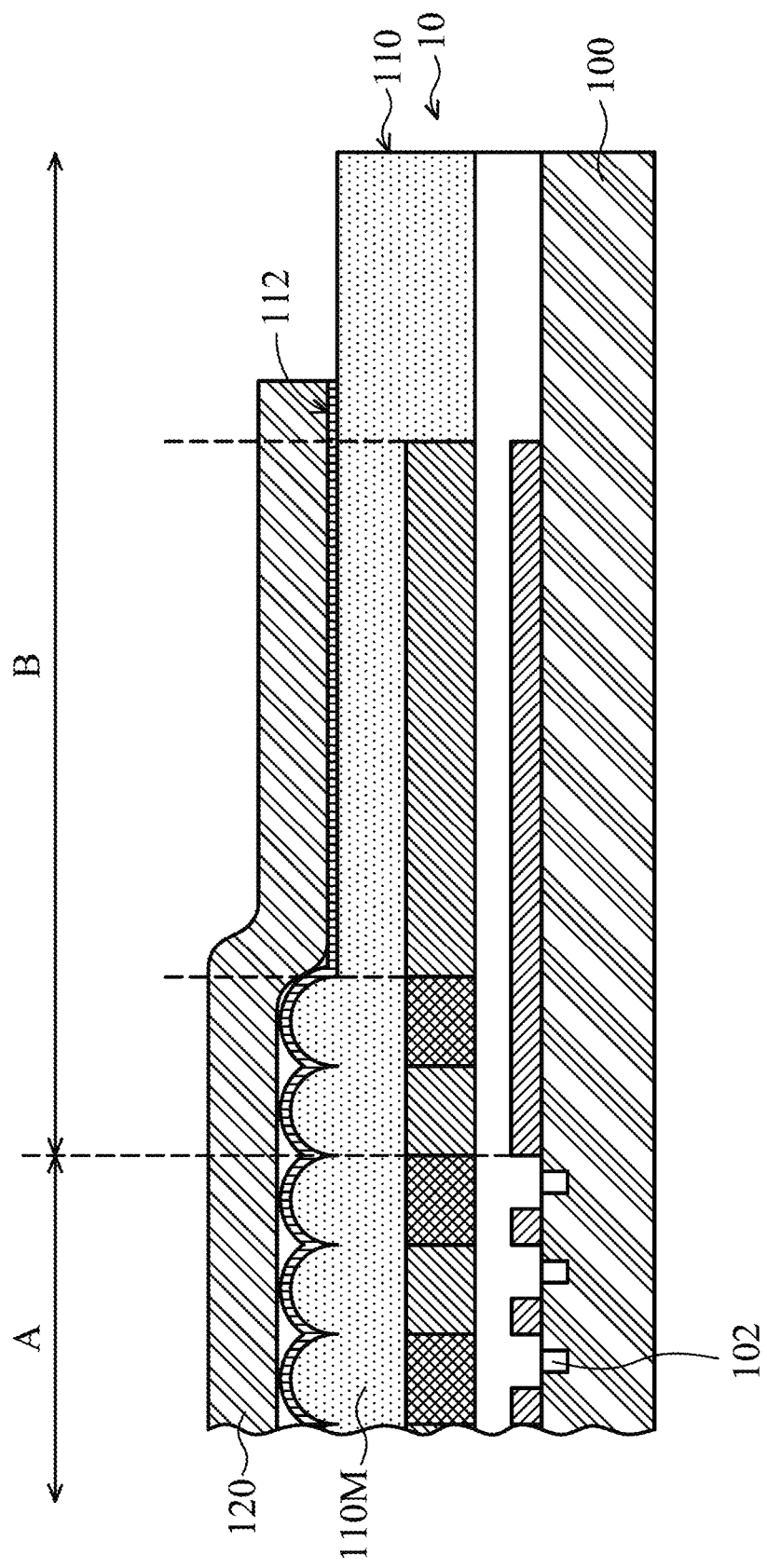
FIG. 1A shows a schematic partial cross section of an imaging device without a dummy pattern, and a tape is attached to the imaging device.

Referring to FIG. 1A, a partial cross section of an imaging device 10 without a dummy pattern and a tape 120 attached to the imaging device 10 is shown. The imaging device 10 has an active area A and a peripheral area B. A number of photodiodes 102 are formed on a substrate 100 in the active area A. In addition, a microlens structure consisting of microlens elements 110M is disposed over the photodiodes 102 in the active area A. The microlens structure is formed of a microlens material layer 110. The microlens material layer 110 extends to a portion of the peripheral area B.

Moreover, a passivation film 112 is conformally formed on the microlens elements 110M and the microlens material layer 110 in the peripheral area B. However, in this example, there is no dummy pattern disposed in the peripheral area B. When the tape 120 is attached on the imaging device 10 in a thinning process of the substrate 100, a contact area between the tape 120 and the passivation film 112 on the microlens material layer 110 in the peripheral area B is almost equal to a surface area of the peripheral area B.

Figure 1B:
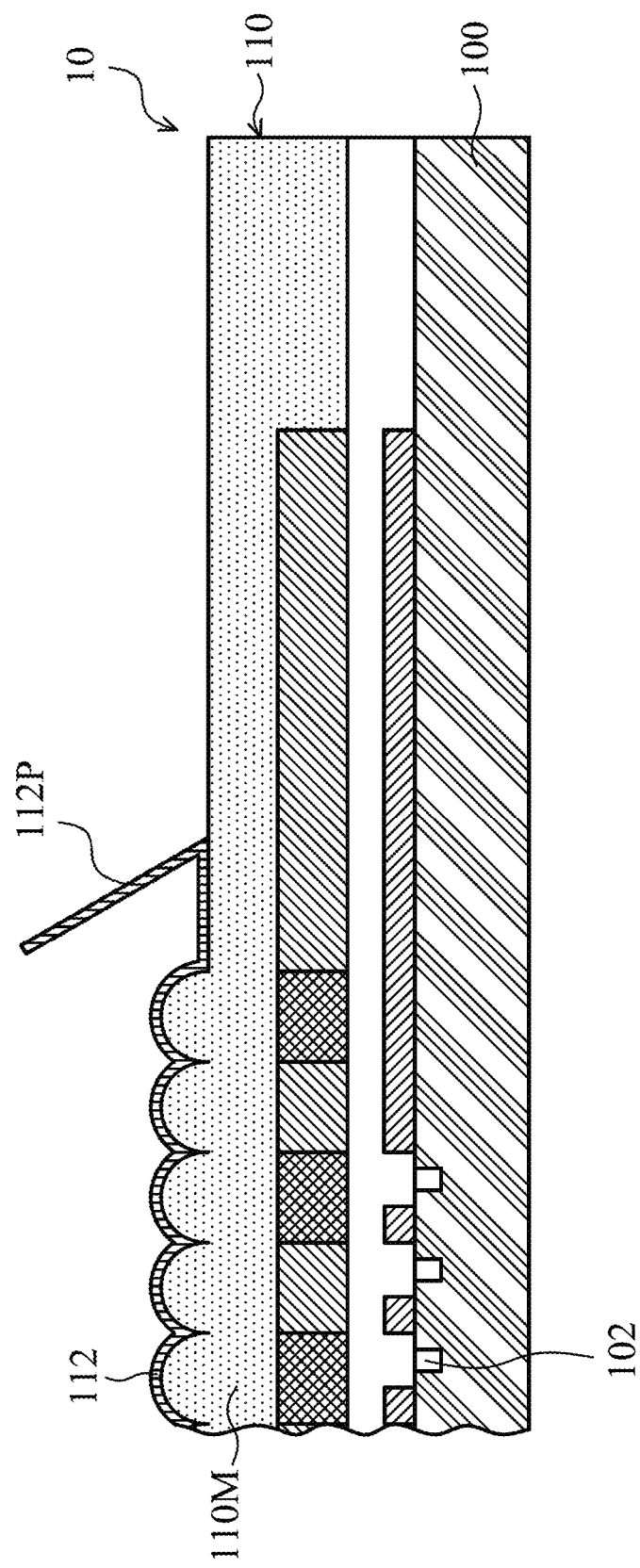
FIG. 1B shows a schematic partial cross section of the imaging device of FIG. 1A after the tape is removed.

Therefore, when the tape 120 is removed from the imaging device 10 after the substrate 100 is thinned, as shown in FIG. 1B, a portion 112P of the passivation film 112, which is originally deposited on the microlens material layer 110 in the peripheral area B, is peeled off. The passivation film peeling issue would disadvantageously reduce the package yield of the imaging device 10.

Figure 2:
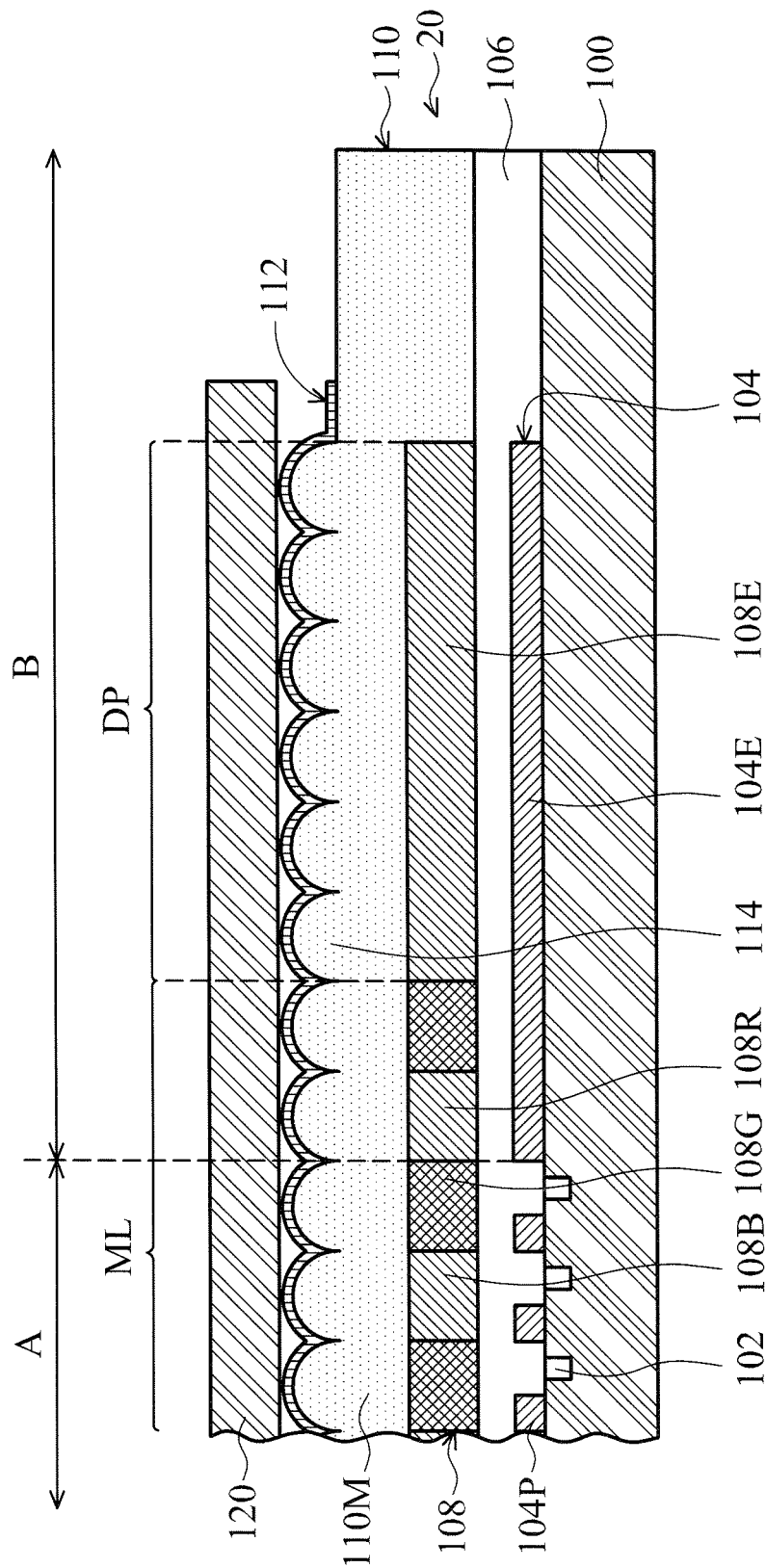
FIG. 2 shows a schematic partial cross section of an imaging device with a dummy pattern according to an embodiment of the disclosure, and a tape is attached to the imaging device.
Figure 3:
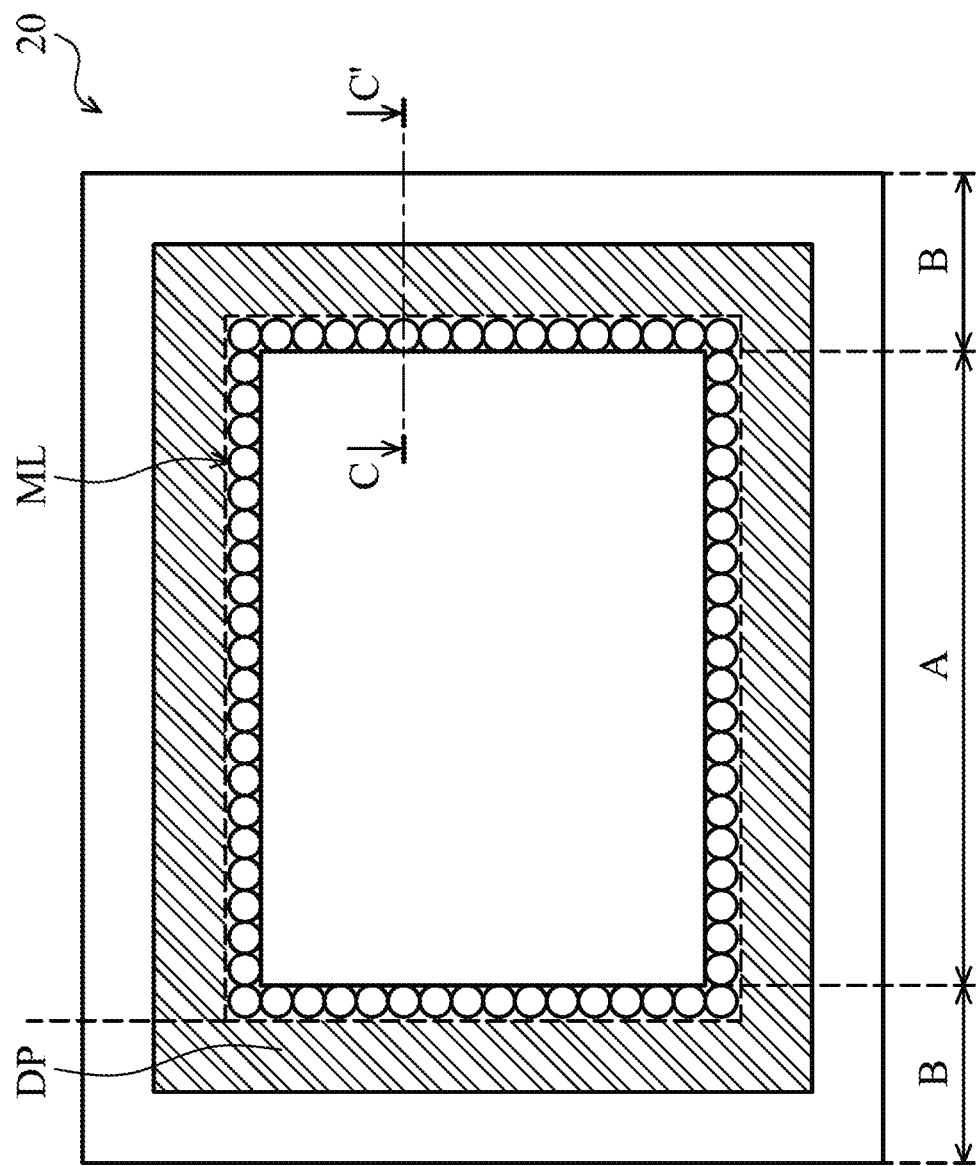
FIG. 3 shows a schematic plane view of an imaging device according to some embodiments of the disclosure.

Now, referring to FIG. 2, a partial cross section of an imaging device 20 with a dummy pattern DP according to an embodiment of the disclosure is shown. In FIG. 2, a tape 120 is attached on the imaging device 20. The imaging device 20 has an active area A and a peripheral area B. Also, referring to FIG. 3, a plane view of the imaging device 20 according to some embodiments of the disclosure is shown. As shown in FIG. 3, the active area A is surrounded by the peripheral area B. FIG. 2 is a partial cross section of the imaging device 20 along a cross-sectional line C-C' of FIG. 3.

As shown in FIG. 2, the imaging device 20 includes a plurality of photoelectric conversion elements 102, such as photodiodes formed on a front side of a semiconductor substrate 100 which would be thinned by a backside polishing process. The semiconductor substrate 100 may be a wafer or a chip divided from a wafer. The photoelectric conversion elements 102 are disposed in the active area A. Each photoelectric conversion element 102 corresponds to each pixel of the imaging device 20. Moreover, a plurality of partitions 104P is formed on the front side of the semiconductor substrate 100 for separating the photoelectric conversion elements 102 from each other. Each partition 104P is disposed between two adjacent photoelectric conversion elements 102 in the active area A. Each pixel of the imaging device 20 can be defined by the partitions 104P. The partitions 104P are formed of a partition material layer 104, such as a metal layer. The partitions 104P may be formed by a deposition, photolithography and etching process. The partition material layer 104 further includes a portion 104E formed on the semiconductor substrate 100 in the peripheral area B.

Various wiring lines and electronic circuits (not shown) of the imaging device 20 may be formed on the semiconductor substrate 100. A planarization layer 106 is formed over the semiconductor substrate 100 to cover the photoelectric conversion elements 102 and the partition material layer 104. The material of the planarization layer 106 may be an organic or an inorganic insulating material, for example epoxy resin or silicon oxide.

A color filter layer 108 is formed on the planarization layer 106. In the active area A, the planarization layer 106 is disposed between the color filter layer 108 and the photoelectric conversion elements 102. The color filter layer 108 includes a plurality of color filter portions, such as color filter portions 108R, 108G and 108B which are colored red, green and blue, respectively. In other embodiments, the color filter portions have other colors and the colors may be arranged by other arrangements. In the active area A, each color filter portion 108R, 108G or 108B individually corresponds to one photoelectric conversion element 102 in each pixel of the imaging device 20. Moreover, some color filter portions are disposed in the peripheral area B and above the portion 104E of the partition material layer 104. The color filter layer 108 further includes an extended portion 108E disposed in a portion of the peripheral area B. The extended portion 108E has one color of that of the color filter portions 108R, 108G and 108B.

Referring to FIG. 2 and FIG. 3, a microlens structure ML is formed over the color filter layer 108. The microlens structure ML is disposed in the active area A and further extends to a portion of the peripheral area B. The microlens structure ML includes a plurality of microlens elements 110M arranged in an array form. The microlens structure ML may be aligned with the color filter portions of the color filter layer 108. Therefore, each microlens element 110M individually corresponds to one color filter portion. The color filter layer 108 is disposed between the microlens structure ML and the photoelectric conversion elements 102. Moreover, each photoelectric conversion element 102 individually corresponds to one color filter portion and further corresponds to one microlens element 110M.

According to some embodiments of the disclosure, a dummy pattern DP is disposed in a portion of the peripheral area B and adjacent to the microlens structure ML. As shown in FIG. 3, the dummy pattern DP surrounds the microlens structure ML. As shown in FIG. 2, the dummy pattern DP is formed over the extended portion 108E of the color filter layer 108. Moreover, the dummy pattern DP connects with the microlens structure ML. The dummy pattern DP includes a plurality of protruding elements 114. In an embodiment, as shown in FIG. 2, each protruding element 114 has a shape the same as that of each microlens element 110M, such as a convex shape.

In some embodiments, the dummy pattern DP is level with the microlens structure ML. In other words, the tops of the convex-shaped protruding elements 114 are level with the tops of the microlens elements 110M. In other embodiments, the dummy pattern DP is lower or higher than the microlens structure ML. In some embodiments, the microlens structure ML and the dummy pattern DP are made of the same material, such as a microlens material layer 110. In some embodiments, the microlens structure ML and the dummy pattern DP are formed together in the same steps. The microlens structure ML and the dummy pattern DP are formed by coating the microlens material layer 110 and performing a photolithography and etching process on the microlens material layer 110.

A passivation film 112 is conformally formed on the surfaces of the microlens structure ML and the dummy pattern DP. In some embodiments, the passivation film 112 continuously covers the microlens structure ML and the dummy pattern DP. In some embodiments, the passivation film 112 is formed of silicon oxide by a chemical vapor deposition (CVD). As shown in FIG. 2, the tape 120 is attached on the imaging device 20 for protection during the backside polishing process of the semiconductor substrate 100. The tape 120 covers the microlens structure ML and the dummy pattern DP and contacts the passivation film 112. According to the embodiment of the disclosure, the dummy pattern DP includes a number of the protruding elements 114. Therefore, the tape 120 located in the peripheral area B outside of the microlens structure ML contacts a portion of the passivation film 112 on the top of the dummy pattern DP. In other words, the tape 120 is in contact with the passivation film 112 located on the tops of the protruding elements 114.

Compared the imaging device 20 of FIG. 2 with the imaging device 10 of FIG. 1A, in the peripheral area B outside of the microlens structure ML, a contact area between the tape 120 and the passivation film 112 of the imaging device 20 with the dummy pattern DP is smaller than that of the imaging device 10 without the dummy pattern DP. In other words, the passivation film 112 on the tops of the protruding elements 114 of the dummy pattern DP has a surface area smaller than a surface area of the peripheral area B outside of the microlens structure ML. In some embodiments, the surface area of the passivation film 112 on the top of the dummy pattern DP, i.e., on the tops of the protruding elements 114, is about 50-80% of the surface area of the peripheral area B outside of the microlens structure ML.

The dummy pattern DP of the disclosure reduces a contact area between the tape 120 and the passivation film 112. Furthermore, the dummy pattern DP of the disclosure increases a contact area between the passivation film 112 and the microlens material layer 110. Therefore, the dummy pattern DP of the disclosure effectively prevents the passivation film 112 from peeling after the tape 120 is removed from the imaging device 20.

Figure 4:
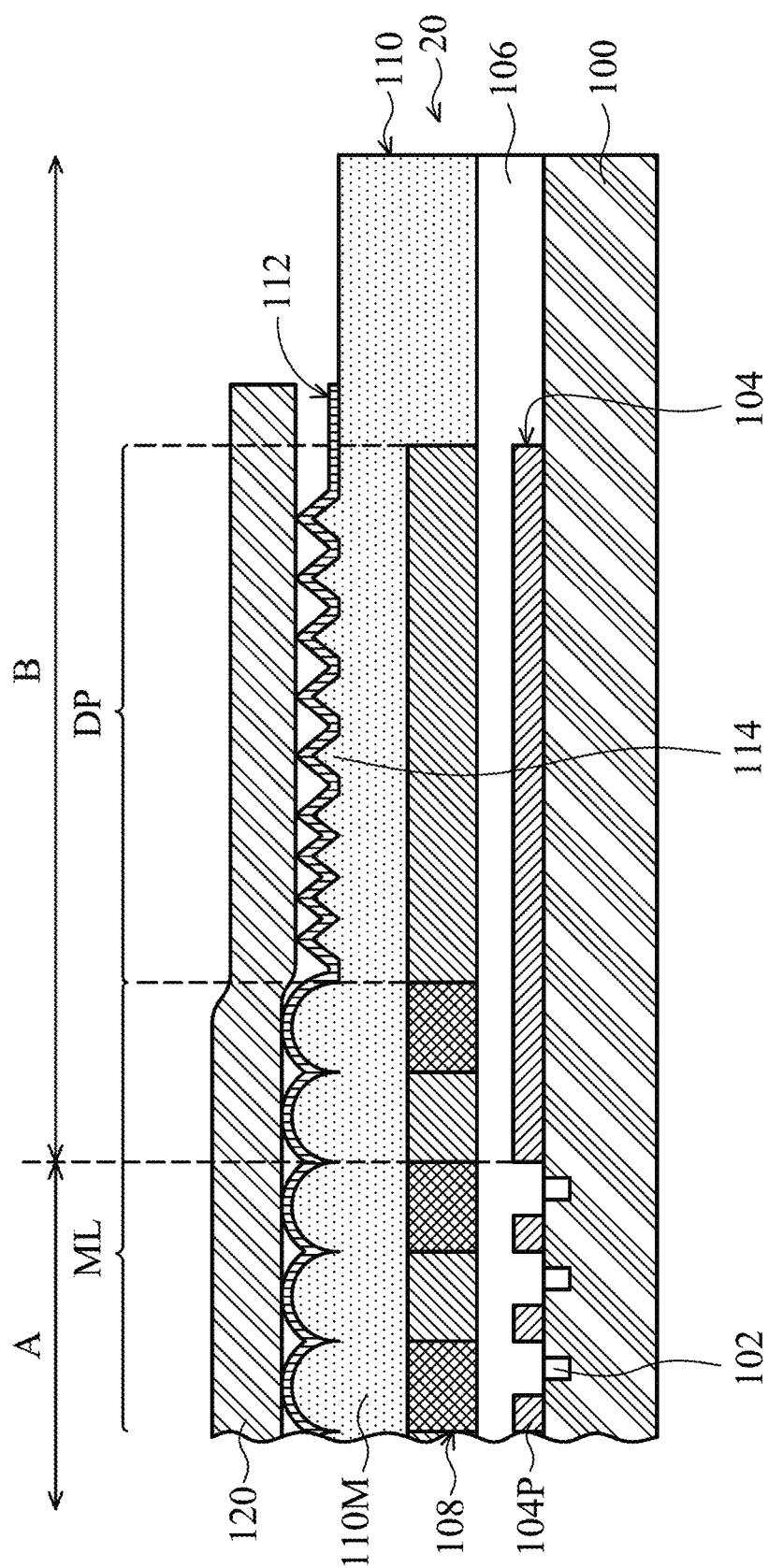
FIG. 4 shows a schematic partial cross section of an imaging device with a dummy pattern according to an embodiment of the disclosure, and a tape is attached to the imaging device.

Referring to FIG. 4, a partial cross section of an imaging device 20 with a dummy pattern DP according to an embodiment of the disclosure is shown and a tape 120 is attached on the imaging device 20. The dummy pattern DP of the imaging device 20 of FIG. 4 includes a plurality of protruding elements 114. In some embodiments, each protruding element 114 of FIG. 4 is shaped like a cone or a pyramid. In an embodiment, each protruding element 114 has the same shape as a cone. The cone-shaped protruding element 114 has a pointed top and a circular bottom. In another embodiment, each protruding element 114 has the same shape of a pyramid. The pyramid-shaped protruding element 114 has a pointed top and a polygonal bottom, for example a triangular, a square, a pentagonal or a hexagonal bottom.

Both the cone-shaped and the pyramid-shaped protruding element 114 reduce a contact area between the passivation film 112 and the tape 120. The cone-shaped and the pyramid-shaped protruding element 114 also increase a contact area between the passivation film 112 and the microlens material layer 110 having the microlens structure ML and the dummy pattern DP. Therefore, the dummy pattern DP with the cone-shaped or the pyramid-shaped protruding elements 114 effectively prevents the passivation film 112 from peeling after the tape 120 is removed from the imaging device 20.

As shown in FIG. 4, in some embodiments, the dummy pattern DP is lower than the microlens structure ML. In other embodiments, the dummy pattern DP may be level with the microlens structure ML. In other words, the tops of the cone-shaped or the pyramid-shaped protruding elements 114 may be level with, or lower than the tops of the microlens elements 110M. In the embodiments of FIG. 4, the top surface of the protruding elements 114 is lower than the top surface of the microlens elements 110M. When the tape 120 is attached on the imaging device 20, the tape 120 firstly contacts the microlens elements 110M. The adhesion between the tape 120 and the protruding elements 114 is worse than that between the tape 120 and the microlens elements 110M. In addition, the contact area between the tape 120 and the protruding elements 114 is only on the tops of the cones or pyramids of the protruding elements 114. Therefore, the passivation film 112 which is conformally formed on the protruding elements 114 is not affected by the tape 120. As a result, it can avoid the passivation film 112 peeling while the tape 120 is tore off from the imaging device 20.

Moreover, the cone-shaped or pyramid-shaped protruding elements 114 of the dummy pattern DP may be arranged densely in an area near the microlens structure ML and arranged sparsely in an area far from the microlens structure ML. This arrangement of the dummy pattern DP can more effectively prevent the passivation film 112 from peeling in the area far from the microlens structure ML.

The cone-shaped or pyramid-shaped protruding elements 114 of the dummy pattern DP and the microlens structure ML are formed of the same material, such as a microlens material layer 110. In some embodiments, the cone-shaped or pyramid-shaped protruding elements 114 of the dummy pattern DP are fabricated in steps separate from those of the microlens structure ML. For example, the microlens structure ML is firstly formed by performing a photolithography and etching process on the microlens material layer 110 to form the shape of the microlens elements 110M. Next, a photolithography and etching process is performed on the same microlens material layer 110 to form the shape of the cone-shaped or pyramid-shaped protruding elements 114 of the dummy pattern DP. The different shapes between the microlens structure ML and the dummy pattern DP are obtained by using different photo-masks, different exposure conditions or different etching rates in the process.

Figure 5:
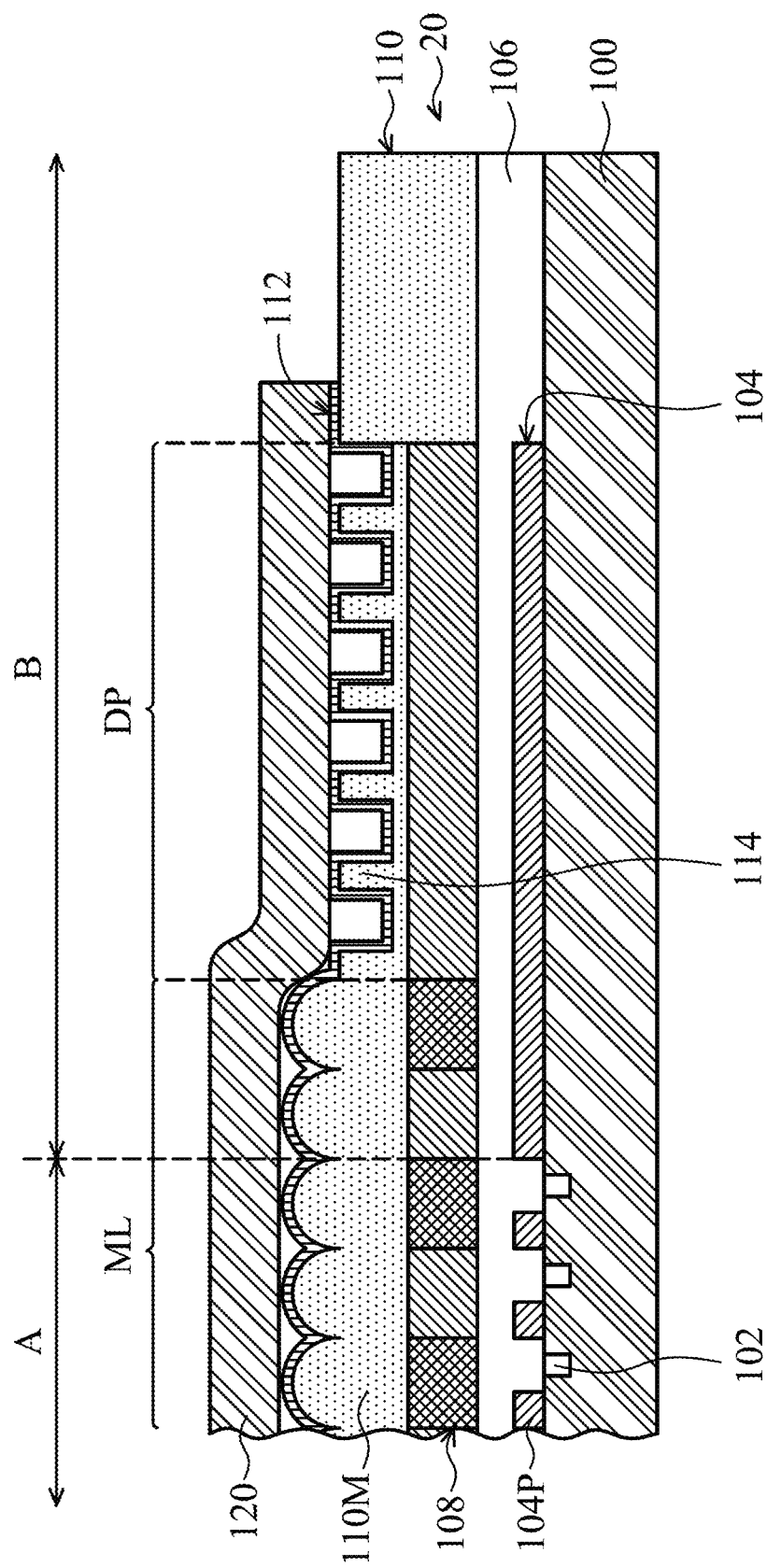
FIG. 5 shows a schematic partial cross section of an imaging device with a dummy pattern according to an embodiment of the disclosure, and a tape is attached to the imaging device.

Referring to FIG. 5, a partial cross section of an imaging device 20 with a dummy pattern DP according to an embodiment of the disclosure is shown and a tape 120 is attached on the imaging device 20. The dummy pattern DP of FIG. 5 includes a plurality of protruding elements 114. In some embodiments, each protruding element 114 has a shape of a cylinder or a prism. Moreover, the cylinder-shaped or the prism-shaped protruding elements 114 are separated from each other. In an embodiment, each protruding element 114 has the shape of a cylinder. The cylinder-shaped protruding element 114 has a circular top and a circular bottom. In another embodiment, each protruding element 114 has the shape of a prism. The prism-shaped protruding element 114 has a polygonal top and a polygonal bottom, for example a triangular top and a triangular bottom, a square top and square bottom, a pentagonal top and a pentagonal bottom, or a hexagonal top and a hexagonal bottom.

The passivation film 112 is conformally formed on the cylinder-shaped or the prism-shaped protruding elements 114. In some embodiments, the passivation film 112 is conformally formed on the surface of the microlens material layer 110 between the protruding elements 114. In other embodiments, the microlens material layer 110 between the protruding elements 114 is removed. The passivation film 112 is conformally formed on the surface of the extended portion 108E of the color filter layer 108 between the protruding elements 114.

A contact area between the passivation film 112 and the tape 120 in the peripheral area B is reduced by the separated cylinder-shaped and the prism-shaped protruding element 114. Furthermore, a contact area between the passivation film 112 and the microlens material layer 110 in the peripheral area B is increased by the cylinder-shaped and the prism-shaped protruding element 114. Therefore, the dummy pattern DP having the separated cylinder-shaped and the prism-shaped protruding element 114 effectively prevents the passivation film 112 from peeling after the tape 120 is removed from the imaging device 20.

As shown in FIG. 5, in some embodiments, the dummy pattern DP is lower than the microlens structure ML. In other embodiments, the tops of the cylinder-shaped or prism-shaped protruding elements 114 may be level with or higher than the tops of the microlens elements 110M. In the embodiments of FIG. 5, the top surface of the protruding elements 114 is much lower than the top surface of the microlens elements 110M as compared with the embodiment of FIG. 4. The top surface of the protruding elements 114 can be lower than or level with the bottom surface of the semicircular portions of the microlens elements 110M. When the tape 120 is attached on the imaging device 20, the tape 120 firstly contacts the microlens elements 110M. The adhesion between the tape 120 and the protruding elements 114 of FIG. 5 is much worse than that between the tape 120 and the microlens elements 110M as compared with the embodiment of FIG. 4. Thus, the cylinder-shaped or prism-shaped protruding elements 114 of FIG. 5 can achieve the same effect as that of FIG. 4, even though the shape of the tips of the protruding elements 114 of FIG. 5 is different from that of FIG. 4, The passivation film 112 which is conformally formed on the cylinder-shaped or prism-shaped protruding elements 114 of FIG. 5 is also not affected by the tape 120. As a result, it can avoid the passivation film 112 peeling while the tape 120 is tore off from the imaging device 20 of FIG. 5.

Moreover, in some embodiments, the spaces between two adjacent cylinder-shaped or prism-shaped protruding elements 114 are the same as or different from each other. In an embodiment, a space between two adjacent protruding elements 114 in an area near the microlens structure ML is smaller than a space between two adjacent protruding elements 114 in an area far from the microlens structure ML. The arrangement of the dummy pattern DP more effectively prevents the passivation film 112 from peeling in the area far from the microlens structure ML.

The cylinder-shaped or prism-shaped protruding elements 114 of the dummy pattern DP and the microlens structure ML are formed from the same material, such as a microlens material layer 110. In the embodiments, the microlens structure ML and the cylinder-shaped or prism-shaped protruding elements 114 of the dummy pattern DP are formed separately in the process steps. The microlens structure ML is firstly formed by performing a photolithography and etching process on the microlens material layer 110 to form the microlens elements 110M. Then, another photolithography and etching process is performed on the same microlens material layer 110 to form the cylinder-shaped or prism-shaped protruding elements 114 of the dummy pattern DP. The different shapes between the microlens structure ML and the dummy pattern DP can be obtained by using different photo-masks, different exposure conditions, different etching rates, etc. in the process steps.

In some embodiments, the protruding elements 114 of the dummy pattern DP, such as the convex-shaped, the cone-shaped, the pyramid-shaped, the cylinder-shaped or the prism-shaped protruding elements 114 are regularly arranged in the peripheral area B. In an embodiment, the peripheral area B is completely occupied by the regularly arranged protruding elements 114 of the dummy pattern DP such as the convex-shaped, the cone-shaped or the pyramid-shaped protruding elements 114. In another embodiment, a portion of the peripheral area B is not occupied by the regularly arranged protruding elements 114 of the dummy pattern DP, such as the convex-shaped, the cone-shaped, the pyramid-shaped, the cylinder-shaped or the prism-shaped protruding elements 114.

In some embodiments, the protruding elements 114 of the dummy pattern DP, such as the convex-shaped, the cone-shaped, the pyramid-shaped, the cylinder-shaped or the prism-shaped protruding elements 114 are randomly arranged in the peripheral area B. In the embodiments, a portion of the peripheral area B is not occupied by the randomly arranged protruding elements 114 of the dummy pattern DP, such as the convex-shaped, the cone-shaped, the pyramid-shaped, the cylinder-shaped or the prism-shaped protruding elements 114.

In the embodiments, an incident light is illuminated on the front-side of the semiconductor substrate 100 which has the photoelectric conversion elements 102 formed thereon. In other words, the photoelectric conversion elements 102 constitute a front-side illuminated image sensor 20. The incident light is collected by the microlens structure ML, passes through the color filter portions 108R, 108G and 108B and the planarization layer 106, and then reaches the photoelectric conversion elements 102.

According to the embodiments of the disclosure, the dummy pattern designs in the peripheral area of the imaging device can reduce a contact area between the tape attached on the imaging device and the passivation film conformally formed on the dummy pattern. Furthermore, the dummy pattern designs can also increase a contact area between the passivation film and the microlens material layer which is used to form the microlens structure and the dummy pattern. Therefore, the dummy pattern designs of the disclosure can effectively prevent the passivation film from peeling when the tape is removed from the imaging device. The dummy pattern designs of the disclosure can overcome the passivation film peeling issue and the yield of the imaging devices is thereby enhanced. Moreover, the dummy pattern is formed of the same material layer as the microlens structure. Therefore, the fabrication cost of the imaging devices is thereby reduced.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An imaging device, comprising:
   a plurality of photoelectric conversion elements formed on a substrate in an active area of the imaging device;
   a microlens structure disposed above the photoelectric conversion elements;
   a dummy pattern disposed above the substrate in a peripheral area of the imaging device surrounding the active area, wherein the dummy pattern includes a plurality of protruding elements and the shape of the protruding element comprises a cylinder, a prism, a cone or a pyramid; and
   a passivation film conformally formed on the microlens structure and the dummy pattern, wherein the passivation film on a top of the dummy pattern has a surface area smaller than a surface area of the peripheral area outside of the microlens structure,
wherein the dummy pattern is randomly arranged in the peripheral area, and a portion of the peripheral area is not occupied by the dummy pattern.

2. The imaging device as claimed in claim 1, wherein the tops of the protruding elements are level with the top of the microlens structure.

3. The imaging device as claimed in claim 1, wherein the top of the dummy pattern is lower than or higher than the top of the microlens structure.

4. The imaging device as claimed in claim 1, wherein the passivation film on the top of the dummy pattern is in contact with a tape covering the microlens structure and the dummy pattern.

5. The imaging device as claimed in claim 1, wherein the surface area of the passivation film on the top of the dummy pattern is 50-80% of the surface area of the peripheral area outside of the microlens structure.

6. The imaging device as claimed in claim 1, further comprising a color filter layer disposed between the microlens structure and the photoelectric conversion elements, wherein the color filter layer includes an extended portion disposed in the peripheral area.

7. The imaging device as claimed in claim 6, wherein the dummy pattern is disposed on the extended portion of the color filter layer.

8. The imaging device as claimed in claim 6, further comprising a planarization layer disposed between the color filter layer and the photoelectric conversion elements.

9. The imaging device as claimed in claim 1, wherein the material of the passivation film comprises a chemical vapor deposition silicon oxide.

10. The imaging device as claimed in claim 1, wherein the microlens structure has a portion extending from the active area to the peripheral area and connected to the dummy pattern.

11. The imaging device as claimed in claim 1, wherein the passivation film covers an entire surface of the microlens structure and the dummy pattern.

12. The imaging device as claimed in claim 1, wherein the material of the dummy pattern is the same as the material of the microlens structure.

13. The imaging device as claimed in claim 1, further comprising a plurality of partitions formed on the substrate, wherein each of the partitions is disposed between two adjacent photoelectric conversion elements.

14. The imaging device as claimed in claim 1, wherein the photoelectric conversion elements comprise photodiodes.

15. The imaging device as claimed in claim 1, wherein the microlens structure is surrounded by the dummy pattern.

* * * * *